United States Patent [19]
Brady

[11] Patent Number: 6,034,909
[45] Date of Patent: Mar. 7, 2000

[54] METHOD AND APPARATUS FOR BIT LINE ISOLATION FOR RANDOM ACCESS MEMORY DEVICES

[75] Inventor: James Brady, Plano, Tex.

[73] Assignee: STMicroelectronics, Inc., Carrollton, Tex.

[21] Appl. No.: 09/183,074

[22] Filed: Oct. 30, 1998

[51] Int. Cl.[7] ........................................ G11C 7/02
[52] U.S. Cl. .................. 365/208; 365/207; 365/189.09; 365/189.11
[58] Field of Search .................. 365/208, 203, 365/207, 189.11, 189.09

[56] References Cited

U.S. PATENT DOCUMENTS

| | | | |
|---|---|---|---|
| 4,933,907 | 6/1990 | Kumanoya et al. | 365/222 |
| 4,984,217 | 1/1991 | Sato | 365/230.09 |
| 5,777,934 | 7/1998 | Lee et al. | 365/203 |
| 5,781,497 | 7/1998 | Patel et al. | 365/230.06 |

*Primary Examiner*—David Nelms
*Assistant Examiner*—Tuan T. Nguyen
*Attorney, Agent, or Firm*—Theodore E. Galanthay; Lisa K. Jorgenson; Andre Szuwalski

[57] ABSTRACT

A circuit for controlling isolation transmission gates connected to the bit lines of a dynamic random access memory (DRAM) device. The circuit includes tri-state circuits which selectively configure transmission gate impedance. The transmission gates are configured for low impedance when stored data is provided to the bit lines. The transmission gates are configured for intermediate impedance when the bit lines are driven towards reference voltage levels. Further, the transmission gates are configured for high impedance to isolate the sense amplifiers from blocks of memory cells that are not involved in the execution of an access to a row of memory cells.

28 Claims, 4 Drawing Sheets

METHOD AND APPARATUS FOR BIT LINE ISOLATION FOR RANDOM ACCESS MEMORY DEVICES

CROSS REFERENCE TO RELATED APPLICATION

The present invention is related to patent application entitled "Voltage Limiting Method and Apparatus for Dynamic Random Access Memory Devices", filed Oct. 30, 1998 Ser. No. 09/183,054 now U.S. Pat. No. 5,949,720, under Attorney Docket No. 98-C-38.

BACKGROUND OF THE INVENTION

1. Technical Field of the Invention

The present invention relates to a control method and device for random access memory (RAM) devices, and particularly to a method and device for controlling bit line isolation circuitry for a dynamic random access memory (DRAM) device.

2. Background of the Invention

There are two known types of semiconductor memory, one referred to as volatile memory and the other referred to as non-volatile memory. In volatile memories the stored data is lost when the power supply is removed from the semiconductor device. A non-volatile memory, on the other hand, retains the data stored for extended periods after the power supply to the device has been removed. In a computer or related systems, non-volatile memory is used for long-term storage of programs and data which seldom or never changes, and volatile memory devices are used for the short-term storage of program instructions and data during the execution of a program.

Volatile memory devices may be divided into two categories. Static Random Access Memory (SRAM) consists of flip-flop latches such that each SRAM latch maintains a bit of data so long as power is provided to the SRAM. In dynamic memories, a charge representing a data bit is stored on a capacitor.

The core of a DRAM is typically partitioned into arrays or blocks of memory cells, with each array including a plurality of rows of memory cells and with the cells in each row being connected to a respective one of a plurality of word lines. Memory cells in each column of cells in an array are connected to a respective one of a plurality of bit lines. Bit lines are grouped in pairs such that when data from a memory cell is read onto a first bit line of a bit line pair, the second bit line of the bit line pair is provided with a voltage level that is representative of a signal between a low logic level and a high logic level, relative to the amount of charge that can be placed thereon by a charge stored in a memory cell. This difference in voltage levels between the bit lines of the bit line pair is the differential to which an associated sense amplifier operatively responds.

Sense amplifiers are typically connected to the bit lines of dynamic memory to sense the small change in potential appearing on the bit lines following a memory cell read operation and to drive the bit lines to the appropriate full reference voltage level, such as Vdd or Vss. Once the sense amplifier drives the bit line to the full reference voltage level, the memory cell from which data was read is refreshed with the full reference voltage signal appearing on the bit line.

Sense amplifiers are operatively connected to a pair of bit lines from one or more memory arrays. Pass and/or transmission gates are employed between the sense amplifiers and the pairs of bit lines from adjacent memory arrays connected to the sense amplifier, in part to limit the capacitance appearing on the bit lines when the sense amplifiers are active, thereby decreasing the time necessary to perform a memory cell read and associated refresh operation. The pass/transmission gates additionally allow the bit lines of the selected bit line pair to incur a slight delay relative to the sense amplifier output nodes as the output nodes are being driven to full reference voltage levels, thereby increasing the speed at which the sense amplifier senses the charge differential of the bit line pair and drives its output nodes. To ensure that the bit lines may be driven to full Vdd and Vss levels, some random access memory designs employ a CMOS transmission gate in which an n-channel transistor and a p-channel transistor are connected in parallel to each other.

Conventional DRAM cells employ a single transistor architecture wherein the memory cell comprises a storage capacitor having a first terminal connected to a reference voltage, such as Vss, and a second terminal connected to a pass gate transistor. The pass gate transistor serves to transport charge to the storage capacitor, and also to read the charged or uncharged state of the storage capacitor. The gate electrode of the pass gate transistor is tied to a word line decode signal and the drain electrode thereof is connected to a bit line. Data is stored in the memory cell as a charge on the storage capacitor. However, because data is stored in a dynamic memory cell as a charge on a capacitor and because memory cells experience leakage current either from the storage capacitor or the pass gate transistor, the stored charge in a dynamic memory cell, particularly a stored charge representing a high logic level, decays over time.

Dynamic memories are created in a number of ways. Dynamic memories that are available as stand-alone, off-the-shelf memory chips are typically fabricated by a process which is specifically tailored to provide optimal DRAM performance. Dynamic memories that are embedded within an integrated circuit chip, however, are commonly fabricated by a process that is not tailored for optimal DRAM performance, but is instead tailored to provide optimal chip-wide performance, such as a process that is suited for size and/or speed considerations. As such, dynamic memories that are embedded within an integrated circuit chip having other circuitry, such as an application specific integrated circuit (ASIC) chip or a microprocessor chip, incur complications and limitations that are not experienced in dynamic memories fabricated by a DRAM-tailored process.

For instance, semiconductor fabrication processes that are tailored for overall performance of an ASIC typically utilize thinner gate oxides relative to gate oxide thicknesses in DRAM-tailored processes. In addition, DRAM-tailored designs typically utilize back gate biasing which is not necessarily employed in ASIC designs. These and other differences lower the threshold voltage of the transistors on the ASIC chip relative to threshold voltages on a chip tailored for optimal DRAM performance. Consequently, for a given gate-source voltage (Vgs), the sub-threshold leakage current for a transistor in an ASIC chip will be greater than a sub-threshold leakage current for a transistor in an integrated circuit fabricated by a DRAM-tailored process. This increase in leakage current for a transistor in an ASIC process is of a particular concern for embedded DRAM devices. Because data is stored in a dynamic memory cell by a stored charge and dynamic memory storage capacitors are typically quite small to achieve relatively high density, a dynamic memory cell may be relatively quickly discharged if sub-threshold leakage currents are not sufficiently controlled, thereby potentially corrupting the data stored in the memory device.

Accordingly, there is a need for a device and method for maintaining sub-threshold leakage current levels associated with memory cells of embedded dynamic memory devices within acceptable limits, taking into consideration memory speed, size constraints and robustness of operation for the embedded dynamic memory device.

SUMMARY OF THE INVENTION

The present invention overcomes shortcomings associated with dynamic memory devices embedded within an integrated circuit chip and satisfies a need for a random access memory device which effectively conditions the electrical connection between sense amplifiers and memory bit lines, and controls leakage current levels within a memory array.

According to the present invention, there is provided a circuit for random access memories embedded within integrated circuit chips, such as an ASIC. The circuit includes a transmission element connected between a bit line pair and the sense amplifier corresponding thereto. The transmission element preferably has a variable impedance.

Specifically, the transmission element of the present invention may be controlled to provide an isolation transmission gate having a low impedance, a high impedance and an intermediate impedance between the low impedance and high impedance values. The isolation transmission gate is configured as a low impedance transmission gate during precharging and equalizing of the bit lines of a bit line pair and when data from a memory cell is placed on the bit line. The isolation transmission gate is configured as a high impedance transmission gate to isolate the sense amplifier from the bit line pair of the memory array that is not involved in a memory cell access. The isolation transmission gate is configured as an intermediate impedance transmission gate when the sense amplifier senses a charge differential appearing on the bit lines and drives the bit lines of the bit line pair to opposite reference voltage levels. When the transmission gate provides an intermediate impedance during sensing and driving of the bit lines by the sense amplifier, the transmission gate combines with dynamic pull-up devices connected to the bit lines of the bit line pair to form a voltage divider between the high and low reference voltage levels so as to limit a minimum voltage appearing on the bit line of the bit line pair driven towards the low reference voltage source by the sense amplifier. Consequently, the transistors of unaccessed memory cells (memory cells in a row of memory cells that is not being written into or read from so that the corresponding memory cell transistors remain turned off) connected to a bit line pulled low by a sense amplifier exhibit less sub-threshold leakage current, thereby better maintaining a stored charge representing a high logic level in the memory cell.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENT

Figure 1:
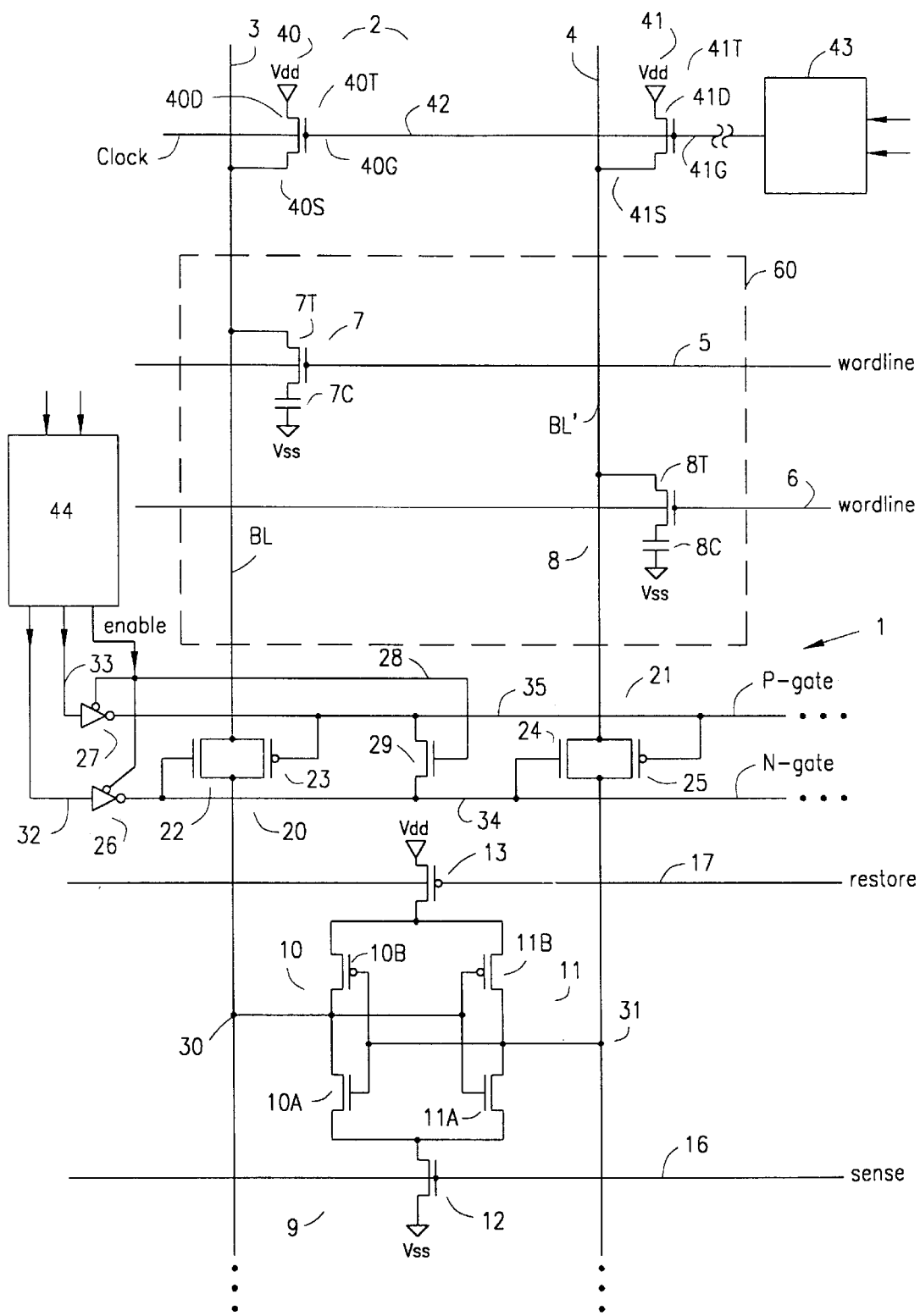
FIG. 1 is a circuit diagram of a preferred embodiment of the present invention in association with a dynamic memory device.

Referring to FIG. 1, there is disclosed a bit line isolation circuit 1 for a dynamic memory device. Bit line isolation circuit 1 is especially suited for employment in dynamic memories embedded within an integrated circuit chip, such as an ASIC chip. It is understood, however, that the present invention may be utilized in other dynamic memory devices, such as standard, off-the-shelf dynamic memory devices.

The dynamic memory device includes a bit line pair 2 having bit lines 3 and 4, and word lines 5 and 6. Dynamic memory cell 7 is connected to bit line 3 and word line 5 such that activating word line 5 turns on pass transistor 7T of memory cell 7, thereby electrically connecting bit line 3 to storage capacitor 7C of memory cell 7. Similarly, dynamic memory cell 8 is connected to bit line 4 and word line 6 such that activating word line 6 turns on pass transistor 8T of memory cell 8, thereby electrically connecting bit line 4 to storage capacitor 8C of memory cell 8.

The dynamic memory device further includes a sense amplifier 9 connected to bit lines 3 and 4. Sense amplifier 9 comprises cross-coupled invertors 10 and 11 which are connected to the low reference voltage level (Vss) via pass transistor 12 and to the high reference voltage level (Vdd) via pass transistor 13. Sense amplifier 9, when connected to Vdd and Vss, senses a charge differential appearing on bit lines 3 and 4 during reading of a memory cell 7 or 8 and drives bit lines 3 and 4 to opposite reference voltage levels.

Bit line isolation circuit 1 includes transmission gates 20 and 21 connected between sense amplifier 9 and bit lines 3 and 4, respectively. In a preferred embodiment of the present invention, transmission gate 20 preferably comprises a CMOS transmission gate including n-channel field-effect transistor 22 and p-channel field-effect transistor 23 connected in parallel. Similarly, transmission gate 21 preferably comprises a CMOS transmission gate including n-channel field-effect transistor 24 and p-channel field-effect transistor 25 connected in parallel.

Bit line isolation circuitry 1 further includes circuitry for controlling transmission gates 20 and 21 such that during an access to a row of memory cells, transmission gates 20 and 21 are configurable as low impedance transmission gates, high impedance transmission gates and intermediate impedance transmission gates having an impedance value which is between the impedance value of transmission gates 20 and 21 when configured as low impedance transmission gates and high impedance transmission gates. By configuring transmission gates 20 and 21 as low, intermediate and high impedance transmission gates during a memory access, the dynamic memory device operates faster with a reduced likelihood of data being corrupted, as explained below.

Accordingly, bit line isolation circuitry 1 preferably includes control circuits 26 and 27 which control the voltage level appearing on the gate electrodes of n-channel transistors 22 and 24 and p-channel transistors 23 and 25, respectively. Control circuits 26 and 27 are tri-state circuits in that control circuits 26 and 27 may be disabled and/or placed in a three-state condition, thereby placing the gate electrodes of transistors 22–25 in an undriven state. Control circuits 26 and 27 are illustrated in FIG. 1 as tri-state logic inverter circuits, but it is understood that control circuits 26 and 27 alternatively may be tri-state non-inverting logic circuits.

Control circuits 26 and 27 and enable signal 28 are preferably driven by timing circuitry 44 which is triggered by memory control signals to configure transmission gates 20 and 21 as low impedance, intermediate impedance and high impedance transmission gates. Timing circuitry 44 preferably configures transmission gates 20 and 21 as high impedance transmission gates when timing circuitry 44 detects that the memory array 60 corresponding to transmission gates 20 and 21 will not be accessed during the execution of a memory operation. Further, timing circuitry 44 preferably configures transmission gates 20 and 21 as low impedance transmission gates during a precharge operation and when data from a row of memory cells from memory array 60 associated with transmission gates 20 and 21 is placed on bit lines 3 and 4. Timing circuitry 44 configures transmission gates 20 and 21 as intermediate impedance transmission gates when timing circuitry 44 detects that bit line 3 or 4 is being driven to a low reference voltage level, such as when sense amplifier 9 drives bit lines 3 and 4 towards opposite reference voltage levels or when input circuitry (not shown) drives bit lines 3 or 4. Timing circuitry 44 also configures transmission gates 20 and 21 as intermediate impedance transmission gates when sense amplifier senses a voltage differential appearing on bit lines 3 and 4, following data from a memory cell being placed thereon.

For example, timing circuitry 44 may preferably utilize, among other memory control signals, row address decode signals, DRAM read/write signals, etc. to provide the necessary control over transmission gates 20 and 21.

Consequently, transmission gates 20 and 21 are configurable as low impedance transmission gates by drive circuit 26 driving the gate electrode of n-channel transistors 22 and 24 towards the high reference voltage level (Vdd) and drive circuit 27 driving the gate electrode of p-channel transistors 23 and 25 towards the low reference voltage level (Vss). Transmission gates 20 and 21 are configurable as high impedance transmission gates by turning off n-channel transistors 22 and 24 and p-channel transistors 23 and 25, i.e., by drive circuit 26 driving the gate electrode of n-channel transistors 22 and 24 towards the low reference voltage level and drive circuit 27 driving the gate electrode of p-channel transistors 23 and 25 towards the high reference voltage level.

Further, transmission gates 20 and 21 may be configured as intermediate impedance transmission gates by disabling control circuits 26 and 27 via enable signal 28 so that the gate electrodes of transistors 22–25 are placed in an undriven state, and equalizing the voltages between the gate electrodes of transistors 22–25. Bit line isolation circuitry 1 preferably further includes equalization transistor 29 which is disposed between the gate electrodes of transmission gate p-channel transistors 23 and 25 (signal P-Gate 35) and the gate electrodes of n-channel transmission gate transistors 22 and 24 (signal N-Gate 34). Turning on equalization transistor 29 via enable signal 28 effectively shorts the gate electrode of transistors 22–25 together. Because control circuits 26 and 27 will most often drive their respective loads to opposite reference voltage levels, disabling control circuits 26 and 27 and equalizing the voltages appearing on gate electrodes of transistors 22–25 will cause those gate electrodes to float at a voltage between the high and low reference voltage levels. This voltage level between the high and low reference voltage levels results in transmission gates 20 and 21 having an impedance that is greater than the impedance of transmission gates 20 and 21 when configured as low impedance transmission gates and less than the impedance of transmission gates 20 and 21 when configured as high impedance transmission gates.

Configuring transmission gates 20 and 21 as intermediate impedance transmission gates while executing a memory operation provides a number of benefits. First, providing a non-zero amount of impedance between sense amplifier 9 and bit lines 3 and 4 following data from a row of memory cells being placed thereon allows sense amplifier 9 to sense the charge differential appearing on bit lines 3 and 4 more quickly. In addition, providing a finite amount of impedance between sense amplifier 9 and bit lines 3 and 4 reduces the likelihood that data appearing on sense amplifier input/output nodes 30 and 31 will be corrupted by noise, radiation or other single event upset when sense amplifier 9 senses a charge differential on bit lines 3 and 4. Second, providing a finite, non-zero impedance between sense amplifier 9 and bit lines 3 and 4 will decrease sub-threshold leakage current levels in the memory cells of the memory array, as explained below.

Control circuits 26 and 27 are illustrated in FIG. 1 as having different input signals. It is understood that the input signals for control circuits 26 and 27 may be logical inversions of each other and still be capable of configuring transmission gates 20 and 21 as low impedance, high impedance and intermediate impedance transmission gates.

Bit lines 3 and 4 are preferably connected to pull-up devices 40 and 41, respectively. Pull-up devices 40 and 41 preferably comprise field-effect transistors 40T and 41T, respectively, whose source electrode 40S of transistor 40T and source electrode 41S of transistor 41T are connected to bit lines 3 and 4, respectively. Drain electrodes 40D and 41D of pull-up transistors 40T and 41T, respectively, are connected to the high reference voltage source, Vdd.

In order to avoid corrupting a charge placed on a bit line 3 or 4 when reading data from a memory cell, pull-up transistors 40T and 41T are dynamic pull-up devices. Gate electrode 40G of transistor 40T and gate electrode 41G of transistor 41T are connected to a common clock line 42. Clock line 42 is controlled by clock circuitry 43 to turn on transistors 40T and 41T only at specific times during normal operation of the dynamic memory device.

Pull-up transistors 40T and 41T preferably comprise n-channel field-effect transistors, but alternatively pull-up transistors 40T and 41T comprise other devices, such as p-channel field-effect transistors.

When configured as intermediate impedance transmission gates, transmission gates 20 and 21 combine with pull-up transistors 40T and 41T to prevent bit lines 3 and 4 from being driven to the low reference voltage level (Vss) when sense amplifier 9 or any other circuit having pull-down devices connected to bit lines 3 and 4, such as memory input-output (I/O) circuitry (not shown) drives either of bit lines 3 or 4 towards Vss. By maintaining the voltage appearing on bit lines 3 and 4 above the low reference voltage level, the sub-threshold leakage current associated with each memory cell connected to the driven bit line that is turned off (not accessed) is decreased. In other words, maintaining the voltage level on bit lines 3 and 4 above Vss reduces the leakage current through the transistors of those memory cells which are connected to bit lines 3 and 4 and are turned off so as to block electrical communication between bit lines 3 and 4 and the memory cells.

Transmission gates 20 and 21 and pull-up transistors 40T and 41T effectively then form voltage divider circuits when pull-down devices associated with bit lines 3 and 4 drive a bit line 3 or 4 towards Vss. Specifically, the impedance of transmission gates 20 and 21 when configured as intermediate impedance transmission gates combines with pull-up transistors 20T and 21T when turned on to form a resistive circuit between Vdd and Vss such that the voltage appearing between transmission gate 20 and pull-up transistor 40T or between transmission gate 21 and pull-up transistor 41T is at a voltage level above Vss but less than a voltage level that may undesirably trigger sense amplifier 9 into a different state.

Figure 2:
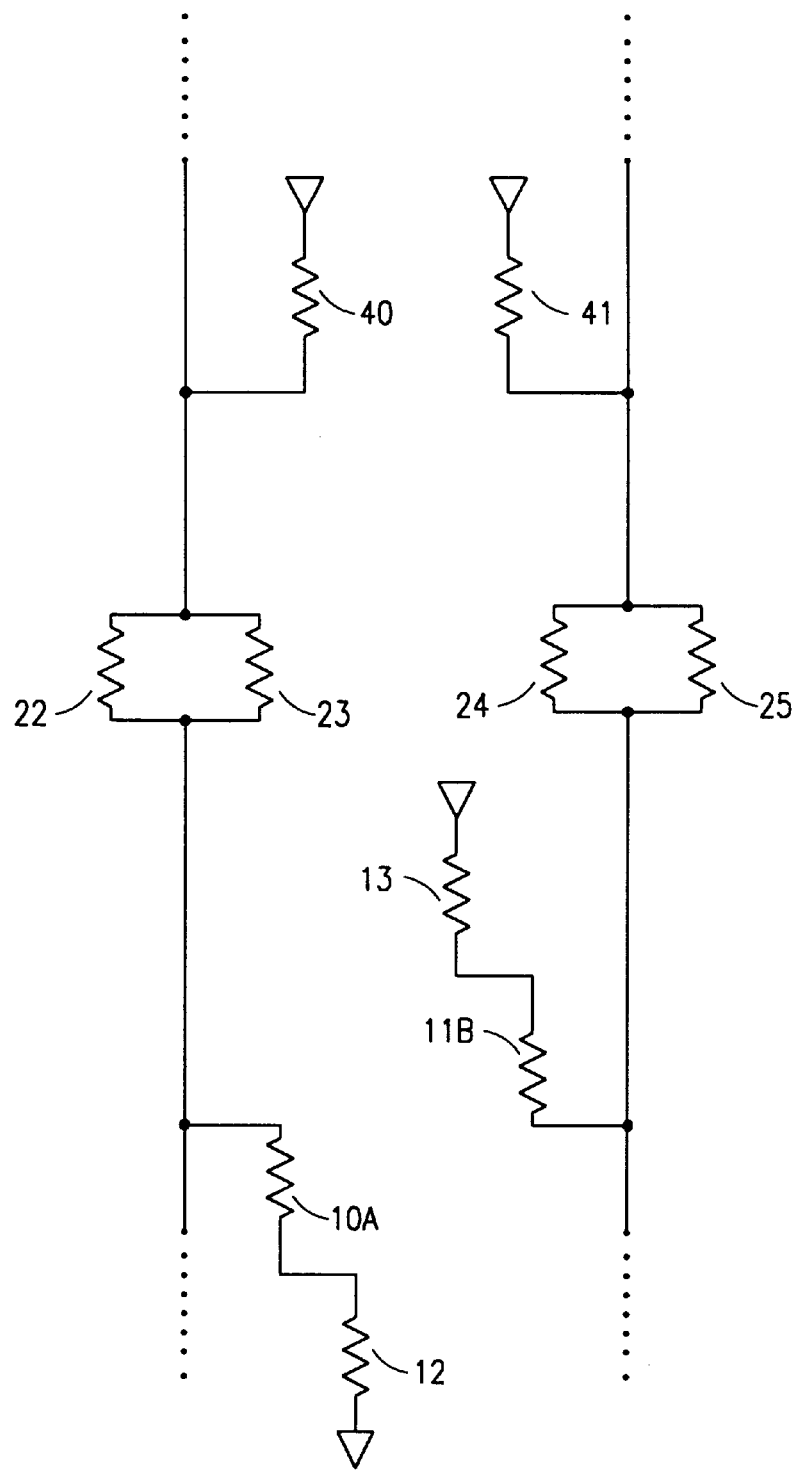
FIG. 2 is an equivalent circuit for the circuit diagram shown in FIG. 1 during execution of a read operation.

FIG. 2 illustrates a resistive circuit equivalence for the circuit of FIG. 1 for the case in which sense amplifier 9 drives bit line 3 towards Vss and bit line 4 towards Vdd. This situation may occur, for example, when sense amplifier 9 senses data representing a logic low level placed on bit line 3 or data representing a logic high level placed on bit line 4, and begins to drive bit lines 3 and 4 accordingly. Bit line 3 is driven towards Vss due to pull-down devices 10A and 12 of sense amplifier 9 being turned on. Bit line 4 is driven towards vdd by pull-up transistors 11B and 13 of sense amplifier 9 being turned on. Representing each turned on transistor as a resistance and ignoring the resistive contribution by the high impedance, turned off transistors, a resistive current path is formed between Vdd and Vss through pull-up transistor 40T, intermediate impedance transmission gate transistors 22 and 23, and sense amplifier pull-down devices lOA and 12, with bit line 3 being disposed between pull-up transistor 40T and transmission gate transistors 22 and 23. Given that the impedance of transistors 22 and 23 when configured as an intermediate impedance transmission gate is substantially greater than the impedances of pull-down transistors 10A and 12, pull-up transistor 40T is suitably sized to provide an impedance level relative to transmission gate transistors 22 and 23 when configured as intermediate impedance transmission gate transistors so that the voltage appearing on bit line 3 may be set to a voltage level greater than Vss but less than a voltage level that may corrupt data represented thereby.

Accordingly, pull-up transistors 40T and 41T are preferably sized so that their respective impedances result in bit lines 3 and 4 being provided a minimum voltage of, for example, a few tenths of a volt. It has been observed that in some ASIC-tailored processes a decrease in gate-source voltage (Vgs) for a turned off transistor of less than a tenth of a volt will reduce sub-threshold leakage current through the transistor by an order of magnitude. The use of pull-up devices 40 and 41 to increase the minimum voltage appearing on bit lines 3 and 4 by a few tenths of a volt will result in a significant reduction in leakage current in those memory cell transistors 7T and 8T that are turned off when their respective bit lines 3 and 4 are pulled towards Vss. By way of one example, the minimum voltage appearing on bit lines 3 and 4 due to the voltage divider circuit of pull-up devices 40 and 41 and transmission gates 20 and 21 is approximately between 0.3 v and 0.5 v.

Pull-up transistors 40T and 41T are activated by clock circuitry 43 to pull bit lines 3 and 4, respectively, towards the high reference voltage level whenever a pull-down device connected to bit lines 3 and 4 pulls bit lines 3 or 4 towards the low reference voltage level. Activating pull-up transistors 40T and 41T prior to the time pull-down devices pull down either bit line 3 or 4 may corrupt data appearing on bit lines 3 and 4. Activating pull-up transistors 40T and 41T well after pull-down devices pull either bit line 3 or 4 towards Vss causes the voltage appearing on bit line 3 or 4 to drop to Vss, thereby resulting in unwanted leakage current levels potentially discharging data stored in memory cells 7 and 8. Accordingly, clocking circuitry 43 preferably includes timing circuitry (not shown) which is triggered by memory control signals to activate pull-up transistors 40T and 41T shortly after pull-down devices connected to bit lines 3 and 4, such as pull-down devices 10A, 11A and 12 of sense amplifier 9, initially pull either bit lines 3 or 4 towards Vss, and maintains pull-up transistors 40 and 41 activated until those pull-down devices no longer pull bit lines 3 or 4 towards Vss. For example, clocking circuitry may utilize, among other memory control signals, restore line 17 to trigger the activation of pull-up devices 40 and 41.

Figure 3:
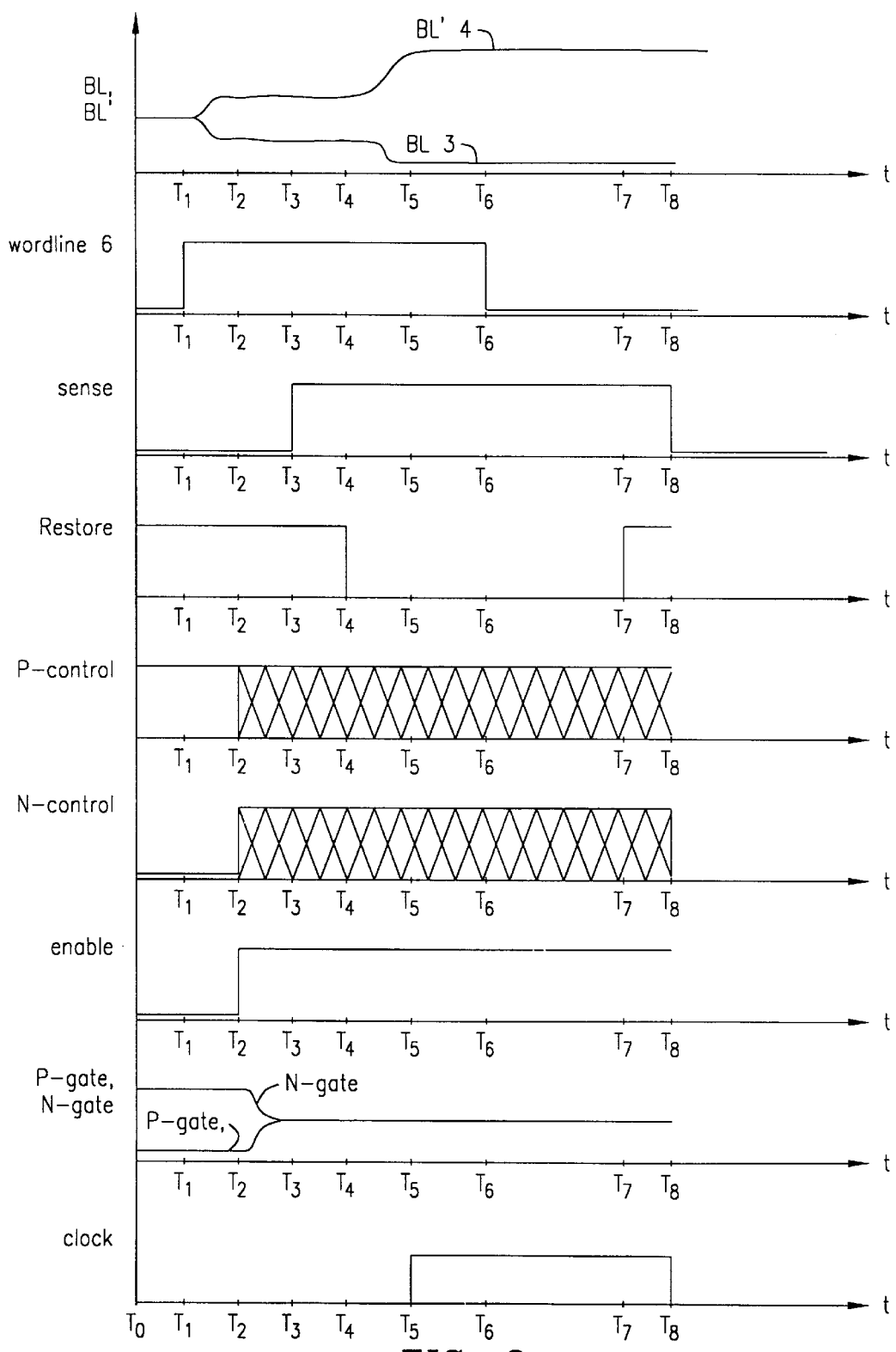
FIG. 3 is a timing diagram illustrating the execution of a read operation for a dynamic memory device utilizing the present invention.

FIG. 3 illustrates the timing involved in executing a read operation from memory cell 8 of the dynamic random memory device. At time T0, bit lines 3 and 4 are equalized and precharged to an intermediate voltage level, such as Vdd/2. At this time, word lines 5 and 6 are driven to Vss so that all memory cell storage capacitors are isolated from bit lines 3 and 4. Sense line 16 is driven to Vss and restore line 17 is driven to Vdd at time T0 to turn off sense amplifier 9. In addition, enable signal 28 is driven to Vss, N-control signal 32 is driven to Vss and P-control signal 33 is driven to Vdd in order to configure transmission gates 20 and 21 as low impedance transmission gates.

At time T1, word line 6 is driven to Vdd to connect its respective row of memory cells to the bit lines. Word line 5 (not shown in FIG. 3) remains driven to Vss throughout the memory read operation. At this time, memory cell transistor 8T is turned on which causes the charge stored on memory cell capacitor 8C to be shared between memory cell capacitor 8C and bit line (BL') 4. Consider the case wherein a charge representing a high logic level is stored on memory capacitor 8C. Following time T1, the voltage appearing on bit line 4 increases slightly above the precharged level while the voltage appearing on bit line (BL) 3 decreases slightly below the precharged level, thereby creating a charge differential between bit lines 3 and 4. At time T2, enable signal 28 is driven to Vdd which disables control circuits 26 and 27 and shorts together the N-Gate signal 34 and the P-Gate signal 35. At this time, the voltage appearing on the gate electrodes of transistors 22–25 is at an equalized level between vdd and Vss, thereby configuring transmission gates 20 and 21 as intermediate impedance transmission gates.

At time T3, sense line 16 is driven towards Vdd which turns on transistor 12 of sense amplifier 9. Shortly thereafter, restore line 17 is driven towards Vss which turns on transistor 13 of sense amplifier 9 at time T4. At this time, sense amplifier 9 is fully powered, thereby enabling sense amplifier 9 to sense the charge differential appearing on bit lines 3 and 4 and to drive bit line 3 towards Vss and bit line 4 towards Vdd.

Sense amplifier 9 is connected to Vss before being connected to Vdd to account for Vdd bussing being generally more noisy than Vss bussing within the integrated circuit. Especially for ASIC chips in which noise appearing on Vdd may occur asynchronously and/or at irregular times relative to the timing of events within the embedded DRAM devices, the sense amplifiers of an embedded DRAM are first connected to Vss to ensure that noise appearing on Vdd is less likely to corrupt data appearing on bit lines 3 and 4 when sense amplifier 9 is initially connected to the high and low reference voltage levels. Alternatively, sense line 16 and restore line 17 may be driven towards Vdd and Vss, respectively, at the same time.

At or around time T4 and after sense amplifier 9 has sufficiently sensed the charge differential appearing on bit lines 3 and 4, bit line 3 is driven towards Vss and bit line 4 towards Vdd by sense amplifier 9. Pull-down devices 10A and 12 then commence driving bit line 3 towards Vss. Prior to the voltage appearing on bit line 3 from reaching Vss, clock circuitry 43, triggered by memory control signals such as restore line 17, drives clock line 42 towards Vdd at time T5, which turns on pull-up transistors 40T and 41T. At this time, turned on pull-up transistor 40T combines with transmission gate transistors 22 and 23 to form a voltage divider circuit, thereby preventing the voltage appearing on bit line 3 from reaching Vss. Since pull-up transistors 11B and 13 are already driving bit line 4 towards Vdd, the presence of pull-up transistor 41T and transmission gate transistors 24T and 25T has little effect on bit line 4.

The read operation is completed by driving word line 6 to Vss at time T6, which isolates its corresponding memory cells, including memory cell 8, from the bit lines. At this time, the data previously stored in memory cell 8 has been refreshed by storing therein an amount of charge corresponding to Vdd. Thereafter, sense amplifier 9 and pull-up devices 20 and 21 are deactivated by restore line 17 being driven to Vdd at time T7, followed by sense line 16 and clock line 22 being driven to Vss at time T8.

The operation of bit line isolation circuit 1 is described above in connection with sense amplifier 9. It is understood that bit line isolation circuit 1 may be similarly utilized in conjunction with other circuitry which may pull either bit line 3 or 4 towards Vss, such as data I/O circuitry (not shown) for the DRAM device. In this regard, transmission gates 20 and 21 are preferably configured by control circuits 26 and 27 as intermediate impedance transmission gates and clock circuitry 43 is timed to drive clock line 42 to Vdd to turn on pull-up devices 40 and 41 whenever a bit line 3 or 4 is pulled towards Vss.

The present invention is described above in association with a single bit line pair 2 of a dynamic memory device. It is understood that the present invention may be preferably associated with each bit line pair of a dynamic memory device. In this case, a pair of transmission gates 20 and 21 and a pair of pull-up devices 40 and 41 may be connected to the bit lines of a distinct bit line pair 2 such that each bit line pair 2 is connected to a distinct pair of transmission gates 20 and 21 and a pair of pull-up devices 40 and 41. Consequently, sub-threshold leakage current from each memory cell in a dynamic memory device may be effectively controlled.

Figure 4:
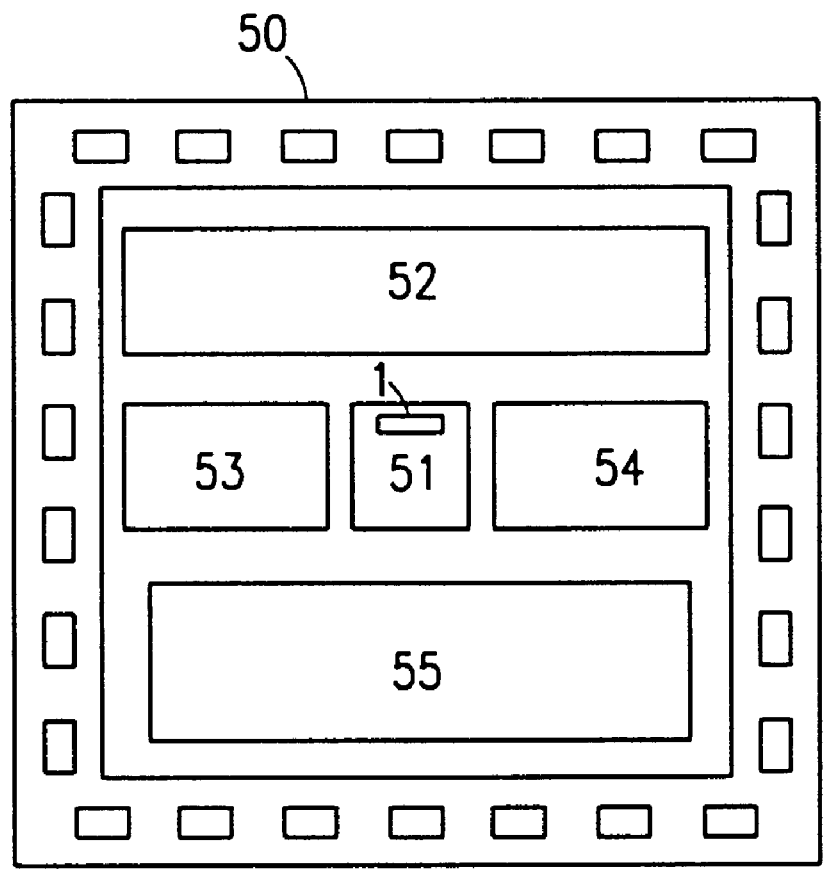
FIG. 4 is a top plan view of an integrated circuit chip having disposed thereon a dynamic memory device according to a preferred embodiment of the present invention.

As stated above, the present invention is particularly suited for dynamic memory devices which are embedded within an integrated circuit fabricated by a process which is not tailored for optimal DRAM performance, such as an ASIC process. FIG. 4 illustrates an ASIC chip 50 having disposed thereon embedded DRAM device 51 (including bit line isolation circuit 1) and other circuitry 52–55 which, when combined, performs a specific application. The bit line isolation circuit 1, when implemented within DRAM device 51, substantially maintains sub-threshold leakage currents within acceptable limits, thereby enhancing the storage handling capability of DRAM device 51.

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A device for a dynamic random access memory (DRAM) device, said DRAM device including a memory array of memory cells, a bit line connected to a column of memory cells, and a sense amplifier connected to said bit line, said device comprising:

a transmission gate connected between said bit line and said sense amplifier, said transmission gate being configurable as a low impedance transmission gate and an intermediate impedance transmission gate having an impedance level that is greater than an impedance level of said low impedance transmission gate; and control means for selectively configuring said transmission gate as said low impedance transmission gate and said intermediate impedance transmission gate during execution of a DRAM operation.

2. The device of claim 1, wherein said control means comprises:

a drive means for driving at least one control electrode of said transmission gate to one or more reference voltage levels to configure said transmission gate as said low impedance transmission gate; and a disable means for selectively disabling said drive means to configure said transmission gate as said intermediate impedance transmission gate.

3. The device of claim 2, wherein:

said transmission gate includes a p-channel field-effect transistor and an n-channel field-effect transistor connected in parallel; and said control means further comprises a means for selectively equalizing voltages between a gate electrode of said p-channel field-effect transistor and a gate electrode of said n-channel field-effect transistor for said transmission gate, for configuring said transmission gate as said intermediate impedance transmission gate.

4. The device of claim 3, wherein:

said means for equalizing voltages comprises a transistor element connected between said gate electrode of said p-channel field effect transistor and said gate electrode of said n-channel field effect transistor.

5. The device of claim 3, wherein:

said means for substantially equalizing a voltage equalizes said voltages between said gate electrodes of said p-channel transistor and said n-channel transistor at the same time said disable means disables said drive means.

6. The device of claim 3, wherein:

said drive means and said disable means comprise a first tri-state circuit having an output connected to a gate electrode of said p-channel field-effect transistor, and a second tri-state circuit having an output connected to a gate electrode of said n-channel field-effect transistor.

7. The device of claim 1, further including:

a pull-up device connected to said bit line; and a clocking means for selectively activating said pull-up device during said execution of said DRAM operation.

8. The device of claim 1, wherein:

said DRAM device includes two memory arrays of memory cells, two bit lines, each bit line being connected to a column of memory cells in a distinct memory array, and said sense amplifier is connected to both bit lines;

said device includes two transmission gates, each transmission gate being connected between said sense amplifier and a distinct bit line and being configurable as said low impedance transmission gate, said intermediate impedance transmission gate and a high impedance transmission gate having an impedance level that is greater than said intermediate impedance level; and said control means selectively configures one of said transmission gates as said low impedance transmission gate and said intermediate impedance transmission gate during said execution of said DRAM operation, and the other of said transmission gates as said high impedance transmission gate during said execution of said DRAM operation.

9. A device for a random access memory device having a memory array of memory cells, a bit line connected to a column of memory cells, a sense amplifier connected to said bit line and memory control signals for controlling the execution of a memory operation, said device comprising:

an electrical component disposed between said sense amplifier and said bit line, said electrical component having a variably controlled impedance; and control circuitry, responsive to said memory control signals, for controlling said electrical component to provide a first impedance level between said bit line and said sense amplifier when data from a memory cell is placed on said bit line and a second impedance level between said bit line and said sense amplifier when said bit line is driven towards a reference voltage level, said second impedance level being greater than said first impedance level.

10. The device of claim 9, wherein:

said random access memory device includes precharge circuitry to precharge said bit line; and said control circuitry controls said electrical component to provide said first impedance level between said bit line and said sense amplifier when said precharge circuitry precharges said bit line.

11. The device of claim 9, further including:

a pull-up device connected to said bit line; and a means, responsive to said memory control signals, for activating said pull-up device when said bit line is driven towards said reference voltage level.

12. The device of claim 11, wherein:

said pull-up device when activated forms a voltage divider circuit with said electrical component when said electrical component provides a second impedance level between said bit line and said sense amplifier.

13. The device of claim 12, wherein:

an impedance level of said pull-up device when activated is greater than said second impedance level provided by said electrical component such that a minimum voltage appearing on said bit line is maintained above said reference voltage level towards which said bit line is driven.

14. The device of claim 9, wherein:

said control circuitry controls said electrical component to provide said second impedance level between said bit line and said sense amplifier when said sense amplifier senses a voltage appearing on said bit line.

15. A method of operating a random access memory device having a memory array of memory cells, a word line connected to a row of memory cells in said memory array, a bit line connected to a column of memory cells in said memory array, a sense amplifier, and a first transmission gate connected between said bit line and said sense amplifier, said method comprising the steps of:

driving said word line towards a reference voltage level to connect a memory cell to said bit line;

configuring said first transmission gate as a low impedance transmission gate during said step of driving a word line;

driving said bit line towards a reference voltage level; and configuring said first transmission gate as a transmission gate having an intermediate impedance during said step of driving said bit line, said intermediate impedance transmission gate having a higher impedance than an impedance of said first transmission gate when configured as said low impedance transmission gate.

16. The method of claim 15, further including the steps of:

precharging said bit line to a voltage level; and configuring said first transmission gate as said low impedance transmission gate during said step of precharging said bit line.

17. The method of claim 15, further including the steps of:

sensing a voltage appearing on said bit line following said step of driving said word line; and configuring said first transmission gate as said intermediate impedance transmission gate during said step of sensing a voltage.

18. The method of claim 15, wherein:

said random access memory device includes two memory arrays of memory cells, two bit lines, each bit line being connected to memory cells in a distinct memory array, and a second transmission gate, wherein said first transmission gate is connected between said sense amplifier and a first of said bit lines associated with a first of said memory arrays and said second transmission gate is connected between said sense amplifier and a second bit line associated with a second of said memory arrays; and said method includes the step of configuring said second transmission gate as a high impedance transmission gate during said step of driving said word line, said high impedance transmission gate having a greater impedance than an impedance of said first transmission gate when configured as said intermediate impedance transmission gate.

19. The method of claim 15, wherein:

said step of configuring said first transmission gate as said low impedance transmission gate includes the step of driving a control electrode of said first transmission gate towards a reference voltage level, and said step of configuring said first transmission gate as said transmission gates having an intermediate impedance includes the step of placing said control electrode of said first transmission gate in an undriven state.

20. The method of claim 15, wherein:

said first transmission gate comprises a first field-effect transistor and a second field-effect transistor;

said step of configuring said first transmission gate as said transmission gate having an intermediate impedance includes the step of equalizing voltage levels appearing on a gate electrode of said first field-effect transistor and a gate electrode of said second field-effect transistor of said transmission gate.

21. The method of claim 15, wherein:

said random access memory device includes a pull-up device connected to said bit line; and said method includes the step of activating said pull-up device during said step of driving said bit line.

22. A random access memory device, comprising:

a memory array of memory cells organized into rows and columns;

a plurality of bit lines, each said bit line being connected to a column of memory cells in said memory cell array;

a plurality of sense amplifiers, said amplifiers being connected to said bit lines;

a plurality of transmission gates, said transmission gates being connected between said bit lines and said sense amplifiers;

control circuitry for turning on said transmission gates during a first portion of a memory operation; and disable circuitry for disabling said control circuitry turning on said transmission gates during a second portion of said memory operation.

23. The dynamic random access memory device of claim 22, further including:

control signals for controlling an execution of said memory operation; and timing circuitry, responsive to said control signals, for controlling said control circuitry and said disable circuitry such that said control circuitry turns on said transmission gates when data stored in a row of memory cells is provided to said bit lines, and said disable circuitry disables said control circuitry to place said transmission gates in an undriven state when said sense amplifiers drive said bit lines towards reference voltage levels.

24. The dynamic random access memory device of claim 22, further including:

control signals for controlling an execution of said memory operation; and timing circuitry, responsive to said control signals, for controlling said control circuitry and said disable circuitry such that said control circuitry turns on said transmission gates when data stored in a row of memory cells is provided to said bit line and said disable circuitry disables said control circuitry to place said transmission gates in an undriven state when said sense amplifiers sense a charge differential between pairs of bit lines.

25. The dynamic random access memory device of claim 22, further including:

control signals for controlling the execution of said memory operation; and timing circuitry, responsive to said control signals, for controlling said control circuitry and said disable circuitry such that said disable circuitry disables said control circuitry to place said transmission gates in an undriven state when said bit lines are driven towards reference voltage levels.

26. The random access memory device of claim 25, further including:

a plurality of pull-up devices, each of said plurality of pull-up devices connected to a bit line; and clock means, responsive to said control signals, for activating said pull-up devices when said bit lines are driven towards said reference voltage levels.

27. The random access memory device of claim 25, wherein:

each transmission gate comprises a first transistor of a first conductivity type and a second transistor of a second conductivity type, said first and second transistors each having a control electrode; and a means, responsive to said control signals, for equalizing voltages on said control electrodes of said first transistors and said second transistors of said transmission gates when said disable circuitry disables said control circuitry.

28. The random access memory device of claim 27, wherein:

said means for equalizing voltages includes at least one transistor connected between said control electrodes of said first transistors and said control electrodes of said second transistors of said transmission gates.

* * * * *